United States Patent
Dixon et al.

(10) Patent No.: US 6,820,226 B2
(45) Date of Patent: Nov. 16, 2004

(54) METHOD, APPARATUS AND COMPUTER PROGRAM PRODUCT FOR CONTENTION TESTING

(75) Inventors: Robert Christopher Dixon, Austin, TX (US); Alan Grant Singletary, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 516 days.

(21) Appl. No.: 10/042,097

(22) Filed: Jan. 7, 2002

(65) Prior Publication Data

US 2003/0131292 A1 Jul. 10, 2003

(51) Int. Cl.[7] ............................................. G01R 31/28
(52) U.S. Cl. ..................... 714/724; 714/25; 324/158.1
(58) Field of Search ................. 714/25, 724; 324/158.1

(56) References Cited

U.S. PATENT DOCUMENTS

| | | | | |
|---|---|---|---|---|
| 5,097,144 A | * | 3/1992 | Chang et al. | 327/109 |
| 5,548,525 A | * | 8/1996 | Albee et al. | 716/4 |
| 6,025,708 A | * | 2/2000 | Stickler | 324/158.1 |
| 6,374,379 B1 | * | 4/2002 | Walker et al. | 714/724 |
| 6,563,298 B1 | * | 5/2003 | Creek et al. | 324/158.1 |
| 6,631,486 B1 | * | 10/2003 | Komatsu et al. | 714/724 |

OTHER PUBLICATIONS

IBM Technical Disclosure, "AC Chip in Place Test", NN74111607, Nov., 1974.*

* cited by examiner

Primary Examiner—Guy J. Lamarre
Assistant Examiner—John P. Trimmings
(74) Attorney, Agent, or Firm—Robert M. Carwell; Anthony V. S. England (57) ABSTRACT

In one aspect of the invention, a method for testing includes interposing a tester between first and second logic. The first logic and second logic have respective first and second output drivers. The tester operates in test cycles to detect dynamic contention responsive to a signal asserted by the first driver during one of the test cycles and a signal asserted by the second driver during an immediately succeeding one of the test cycles. Static contention is detected responsive to a signal asserted by the first driver during one of the test cycles and a signal asserted by the second driver during the same one of the test cycles.

14 Claims, 6 Drawing Sheets

METHOD, APPARATUS AND COMPUTER PROGRAM PRODUCT FOR CONTENTION TESTING

BACKGROUND

1. Field of the Invention

This invention relates generally to testing of designs for integrated circuits, and more particularly to testing for contention among drivers in such designs.

2. Related Art

With modern technology, a tiny integrated circuit having a huge number of transistors can be fabricated in large quantities at a relatively small per unit cost. However, in absolute terms the set up cost for fabrication is not cheap. To achieve low per unit cost integrated circuit chips must be produced in large quantities. Because it is expensive to set up fabrication, and because chips having perhaps millions of transistors are complicated and subject to design glitches, it is common to emulate a chip and extensively test the emulated chip before fabrication.

It is also quite common for chips to interface with one another. In this circumstance, testing is not as simple as just testing a single chip's functionality. Interaction between the chips must also be tested. But even with extensive conventional testing, chips may appear to interact properly and yet have undetected problems.

One commonly undetected problem concerns contention between drivers. This occurs when two drivers that share a transmission line or node both drive at the same time. It is particularly problematic to detect contention because when two drivers contend, one of the drivers typically overpowers the other. This may result in correct logic functioning due to the happenstance of which of the drivers happens to win. However, while correct logic functioning is good, it is not all that matters. Contention that does not impair logic function is still undesirable because it causes unnecessary noise and power dissipation. Moreover, even contention that does not initially impair logic function may lead to incorrect functioning later. For example, logic designs for chips may be somewhat independent of drivers. Thus, in one instance chips may have their logics fabricated with one type of drivers, in which case the chips interact successfully, but in another instance the chips may have a different type of drivers and no longer function properly together. Therefore, a need exists for improvements in testing for contention.

SUMMARY

The foregoing need is addressed in the present invention. In one aspect of the invention, a method for testing includes interposing a tester between first and second logic. The first logic and second logic have respective first and second output drivers. The tester operates in test cycles to detect dynamic contention responsive to a signal asserted by the first driver during one of the test cycles and a signal asserted by the second driver during an immediately succeeding one of the test cycles. Static contention is detected responsive to a signal asserted by the first driver during one of the test cycles and a signal asserted by the second driver during the same one of the test cycles.

In an apparatus form, a tester is for interposing between first and second logic. The first logic and second logic have respective first and second output drivers and the tester is operable in test cycles to periodically test for contention between the drivers. The tester has tester logic, a first tester node for coupling to the first logic driver, and a second tester node for coupling to the second logic driver. A switch of the tester is coupled to the first and second tester nodes, and the tester logic is operatively coupled to the switch to open the switch during a certain interval of the test periods, so that the respective first and second logic may be electrically decoupled from one another. A first test receiver is coupled to the first tester node and to the tester logic for sensing a signal on the first node. Likewise, a second test receiver is coupled to the tester second node and to the tester logic for sensing a signal on the second node. The periodic testing for contention includes signals of the logic output drivers during the certain interval being registered by the tester logic responsive to the respective test receivers.

In another aspect, the tester has a first test source coupled to the first tester node for asserting and de-asserting signals on the first node during one portion of the certain interval responsive to the tester logic, and a second test source coupled to the second tester node for asserting and de-asserting signals on the second node during another portion of the certain interval, also responsive to the tester logic. The test receivers sense the logic driver signals during the certain interval responsive to the test source signals.

Other aspects, as well as advantages and objects of the invention will become apparent upon reading the following detailed description and upon reference to the accompanying drawings.

DETAILED DESCRIPTION

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
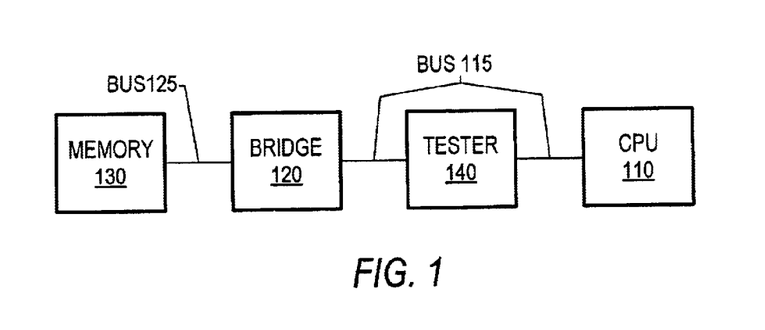
FIG. 1 illustrates a test arrangement, according to an embodiment of the present invention.

Referring now to FIG. 1, a test arrangement is illustrated, according to an embodiment of the present invention. In the illustrated embodiment, a bus bridge 120 under development and testing goes between a central processing unit ("CPU") 110 and a memory 130. As illustrated, a tester 140 is interposed on bus 115 between the bridge 120 and CPU 110, for testing aspects of operation of the bridge 120 which relate to the CPU 110.

In the illustrated testing arrangement, the CPU 110 and memory 130 are actual, very large scale integrated circuitry ("VLSI") parts, which have respective specified operating frequencies. For example, in an embodiment, the CPU 110 is specified for operation at 1000 MHz, while the memory 130 has a specified operating frequency of 200 MHz. Likewise, the bus bridge 120 has a specified operating frequency, which, in an embodiment, corresponds to that of the memory 130, that is, 200 MHz.

In the arrangement illustrated, an emulated version of the bridge 120 is being tested. That is, the bridge 120 is not yet fabricated as one or more VLSI parts. Rather, the bridge 120 as shown in FIG. 1 is instantiated in one or more field programmable gate arrays ("FPGA's") as a representation of the final part. In another embodiment, the bridge 120 is emulated for the most part by a software program representing logic of the bridge 120. In this alternative sort of emulation, the software program representing the logic runs on a computer system, or more typically on numerous computer systems running concurrently, and actual hardware drivers for the bridge 120 interface to the program so that the functioning of the emulated bridge 120 can be tested with respect to external parts, that is, memory 130 and CPU 110.

Neither the FPGA emulation of the bridge 120, nor the software emulation are capable of operating at the specified frequency for the finally fabricated bridge. The emulation in which the logic of the bridge 120 is represented by software is capable of operating at only a very low frequency, depending upon a number of factors, such as the computing resources available. In a typical test run, a software emulation may require hours of run time to emulate a single cycle of bridge 120 operation. The FPGA emulation is capable of operating at a frequency that is much faster than the software emulation. In an embodiment, the FPGA emulated bridge 120 is capable of operating at a frequency of 2 MHz.

For testing with the emulated bridge 120, the CPU 110 and memory 130 are operated at the bridge 120 emulation testing frequency, such as 2 MHz for the FPGA emulation, and not at their specified, normal operating frequencies. Ordinarily, the specified operating frequency for a memory and bridge is limited by timing issues that concern reliably driving signals onto an interconnecting bus and capturing signals from the bus. Thus, in this testing circumstance, the non-emulated devices are being operated at a much lower frequency than their capabilities would permit. Consequently, a great deal of the time during a test cycle is not needed or used for driving, transmitting or capturing signals on the bus. This gives rise to an opportunity to use the otherwise unused time in a test cycle to perform additional analysis. The unused time in the present embodiment is used to test for contention among drivers.

Figure 2:
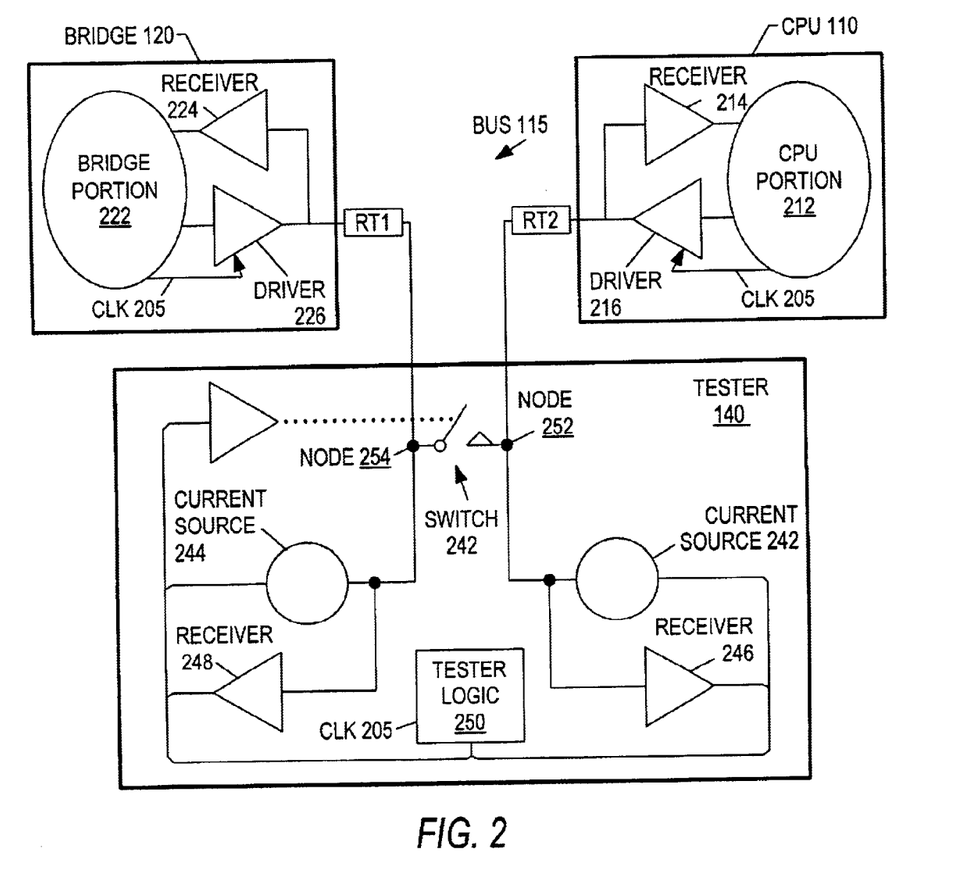
FIG. 2 illustrates certain aspects of the tester and devices under test, according to an embodiment of the present invention.

Referring now to FIG. 2, details are shown of aspects of the tester 140, CPU 110 and bridge 120 of FIG. 1. The tester 140 has a first tester node 252 connected to a portion of bus 115 that terminates at terminating resistor RT2 on CPU 110, and a second tester node 254 connected to another portion of bus 115 that terminates at terminating resistor RT1 on bridge 120. The illustrated portion of CPU 110 has a receiver 214 coupled to a terminating resistor RT2 for receiving signals from the bus 115, and driver 216 synchronized by a clock 205 for driving signals on the terminating resistor RT2 and bus 115. It should be understood that CPU portion 212 includes other receivers and drivers, as well as CPU 110 logic, memory registers, etc. Likewise, the illustrated portion of bridge 120 has a receiver 224 coupled to a terminating resistor RT1 for receiving signals from the bus 115, and a driver 226 synchronized by clock 205 for driving signals on the terminating resistor RT1 and bus 115. Similarly, it should be understood that bus bridge portion 222 includes other receivers and drivers, logic, memory registers, etc.

Interconnecting the first tester node 252 and second tester node 254 is an electronic switch 242 operatively coupled to tester logic 250, which opens and closes responsive to the tester logic 250, in order to decouple and couple the portions of bus 115, and, correspondingly, CPU 110 and bridge 120. The tester 140 also has a first current source 242 coupled to the first tester node 252 and a second current source 244 coupled to the second node 254. The current sources 242 and 244 are operatively coupled to tester logic 250 to drive signals on to the nodes 252 and 254, responsive to tester logic 250. The tester 140 also has a first receiver 246 and a second receiver 248 coupled to the respective nodes 252 and 254 and operatively coupled to the tester logic 250 for sensing signals on the nodes, responsive to the tester logic 250. The tester logic 250 also receives clock 205, which operates at the emulation testing frequency for synchronizing the testing.

Figure 3:
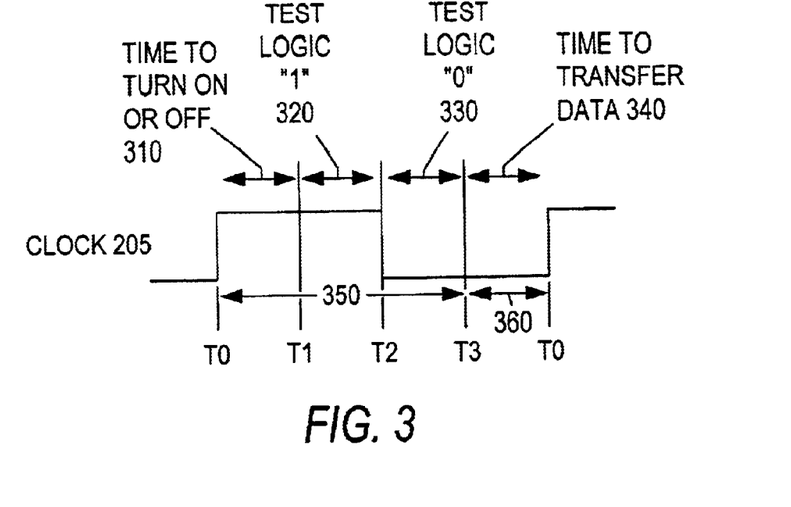
FIG. 3 illustrates certain timing aspects of testing, according to an embodiment of the present invention.

Referring now to FIG. 3, certain timing aspects of the operation of tester 140, CPU 110 and bridge 120 are illustrated for one test cycle of clock 205, according to an embodiment.

During the first three-quarters of the cycle, that is, interval 350 from time t0 to time t3, tester logic 250 opens switch 242 of tester 140 (FIG. 2), so that any signals driven onto the bus 115 by drivers 216 and 226 are not transferred between CPU 110 and bridge 120 during this interval 350. During the last quarter of the cycle, that is, interval 360 from time t3 to time t0 of the next cycle, tester logic 250 closes the switch 242, so that any signals driven onto the bus 115 by drivers 216 and 226 are transferred between CPU 110 and bridge 120 during this interval.

During a first portion of the first interval 350, that is, interval 310 from time t0 to time t1, tester 140 waits to give drivers 216 and 226 time to turn on or off and thereby drive signals onto the bus 115. Then, during the next portion of the first interval 350, that is interval 320 from time t1 to time t2, tester logic 250 causes current sources 242 and 244 to attempt to drive logical "1" signals on the bus 115, and causes receivers 246 and 248 to sense the respective node 252 and 254 voltages. Then, during the next portion of the first interval 350, that is interval 330 from time t2 to time t3, tester logic 250 causes current sources 242 and 244 to attempt to drive logical "0" signals on the bus 115, and causes receivers 246 and 248 to again sense the respective node 252 and 254 voltages.

The voltages sensed by receivers 246 and 248 responsive to signals driven by current sources 242 and 244 depend upon the states of drivers 216 and 226. That is, for example, if driver 216 is not actively driving a signal during the test cycle, then the tester node 252 voltage will follow the signal driven by current source 242. In this case, during interval 320 receiver 246 will sense that node 252 is high. Then, during interval 330 receiver 246 will sense that node 252 is low and this will be registered by tester logic 250. On the other hand, current source 242 is intentionally designed such that if a driver 216 is actively driving during the cycle, then the driver 216 signal will overpower the current source 242 signal, so that during both intervals 320 and 330 the same signal, i.e., whatever signal the driver 216 is driving, will be sensed by receivers 246 and registered by tester logic 250. After registering the signals sensed in intervals 320 and 330 on node 252, for example, tester logic 250 compares the signals and determines whether driver 216 is active or not.

Figure 4:
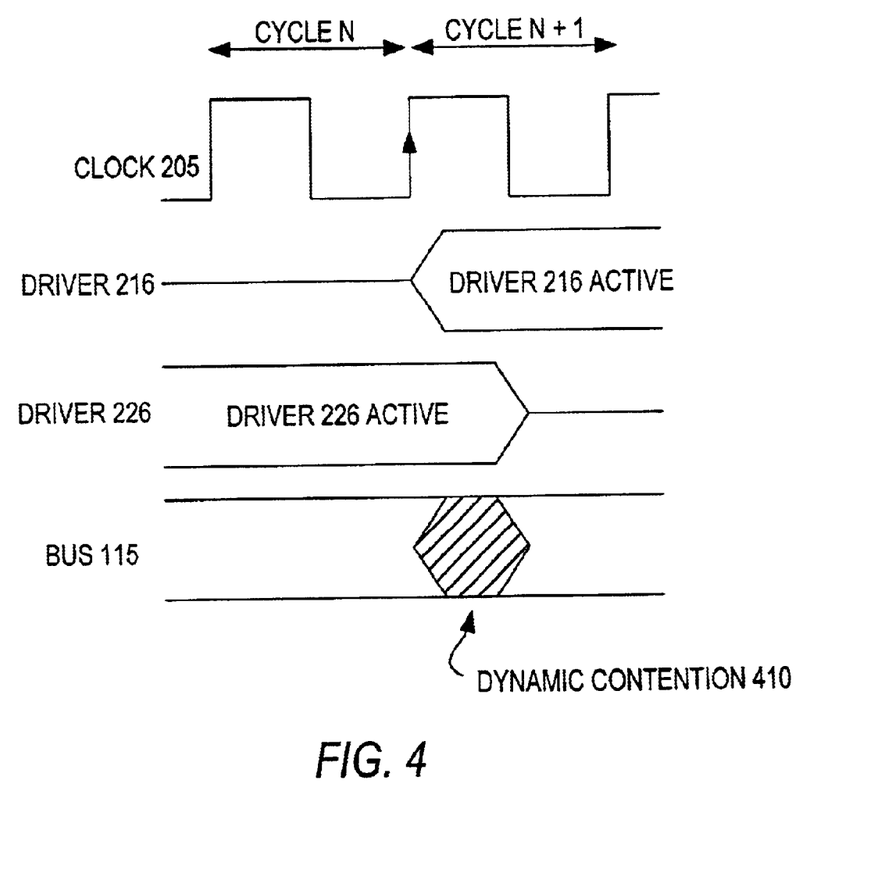
FIG. 4 illustrates certain aspects of detecting dynamic contention, according to an embodiment of the present invention.

Referring now to FIG. 4, certain aspects are illustrated concerning how tester logic 250 detects dynamic contention between drivers 216 and 226 responsive to the signals driven by sources 242 and 244, sensed by receivers 248 and 246, and registered by test logic 250. In the example illustrated, driver 226 is active during test cycle N, and turns off responsive to the rising edge of clock 205 in cycle N+1. Driver 216 is not active during test cycle N, but turns on responsive to the rising edge of clock 205 in cycle N+1. Tester logic 250 detects dynamic (a.k.a. "transient") contention responsive to registering that driver 226 was active in cycle N but not in cycle N+1, and that driver 216 was not active in cycle N, but was active in cycle N+1.

Figure 5:
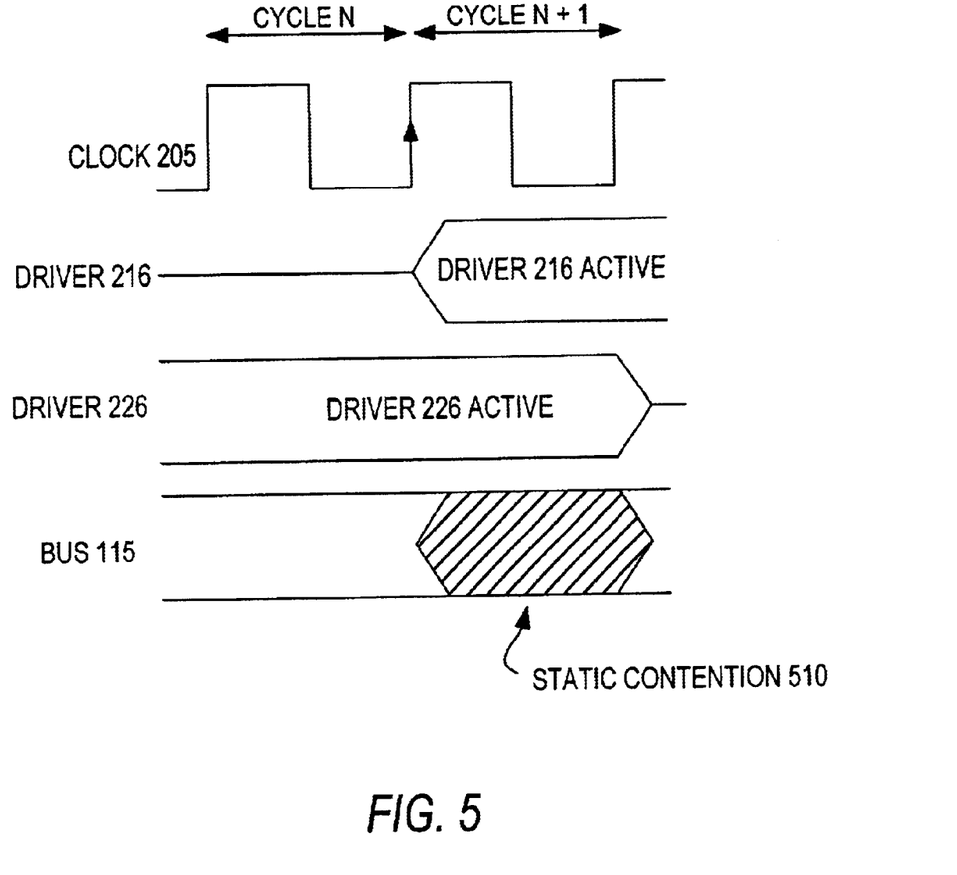
FIG. 5 illustrates certain aspects of detecting static contention, according to an embodiment of the present invention.

Referring now to FIG. 5, certain aspects are illustrated concerning how tester logic 250 detects static contention between drivers 216 and 226 responsive to the signals driven by sources 242 and 244, sensed by receivers 248 and 246, and registered by test logic 250. In the example illustrated, driver 226 is active during both test cycles N and N+1, and turns off responsive to the rising edge of clock 205 in cycle N+2. Driver 216 is not active during test cycle N, but turns on responsive to the rising edge of clock 205 in cycle N+1. Tester logic 250 detects static contention responsive to registering that drivers 216 and 226 are both active in cycle N+1.

Figure 6:
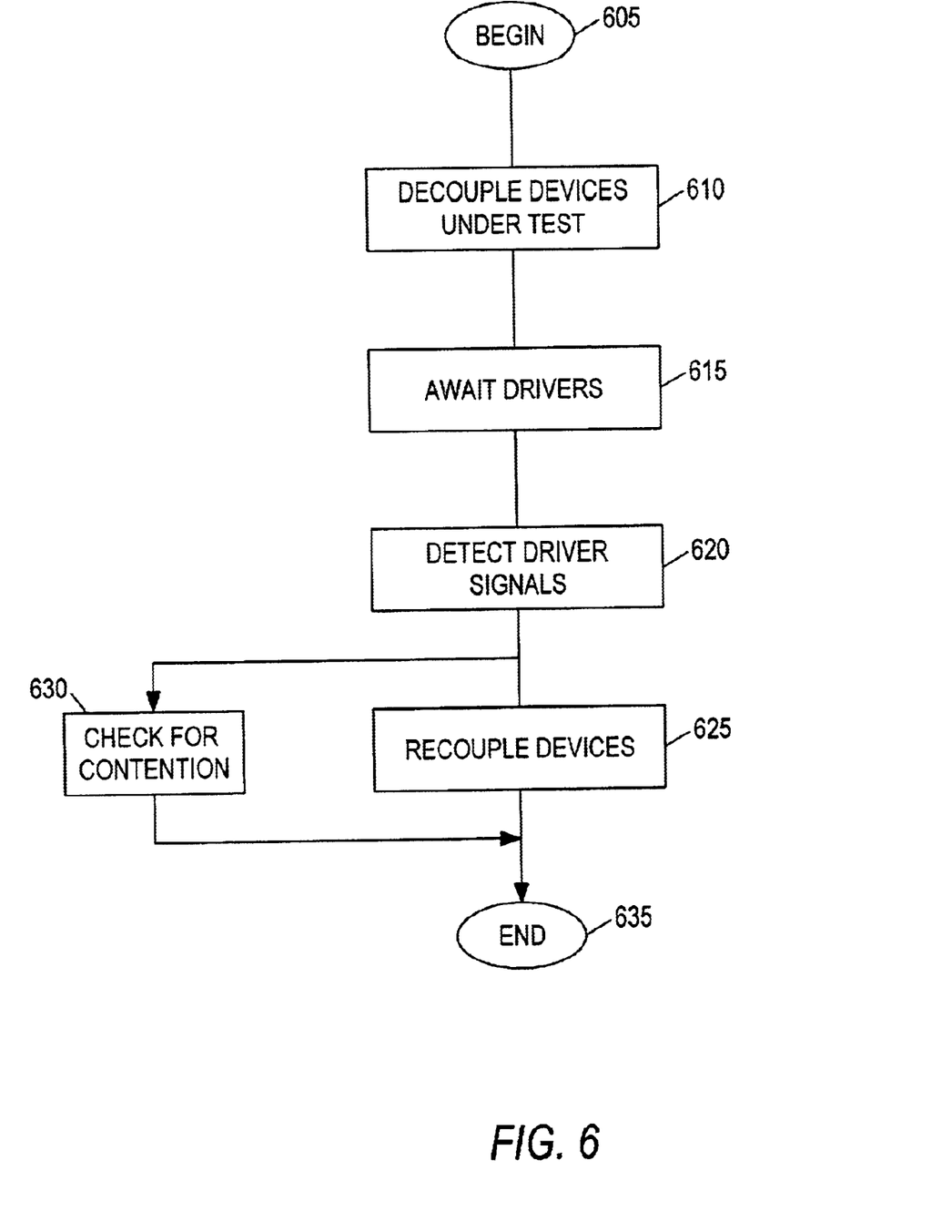
FIG. 6 illustrates certain method steps of the testing, according to an embodiment of the present invention.

Referring now to FIG. 6, certain method aspects of a test cycle are illustrated, according to an embodiment. Beginning after 605, devices that are being tested, such as CPU 110 and bridge 120 in FIG. 1, are decouple from one another at 610 by the tester. Next, at 615, the tester waits for drivers in the devices being tested to begin driving signals. Then, at 620, the tester detects driver signals for an interval. Next, at 625, before the end of the cycle the tester recouples the devices being tested to permit data to transfer between them. Concurrently, at 630, logic in the tester analyzes the driver signals that were detected in order to check for contention. The method steps for FIG. 6 then end at 635.

Figure 7:
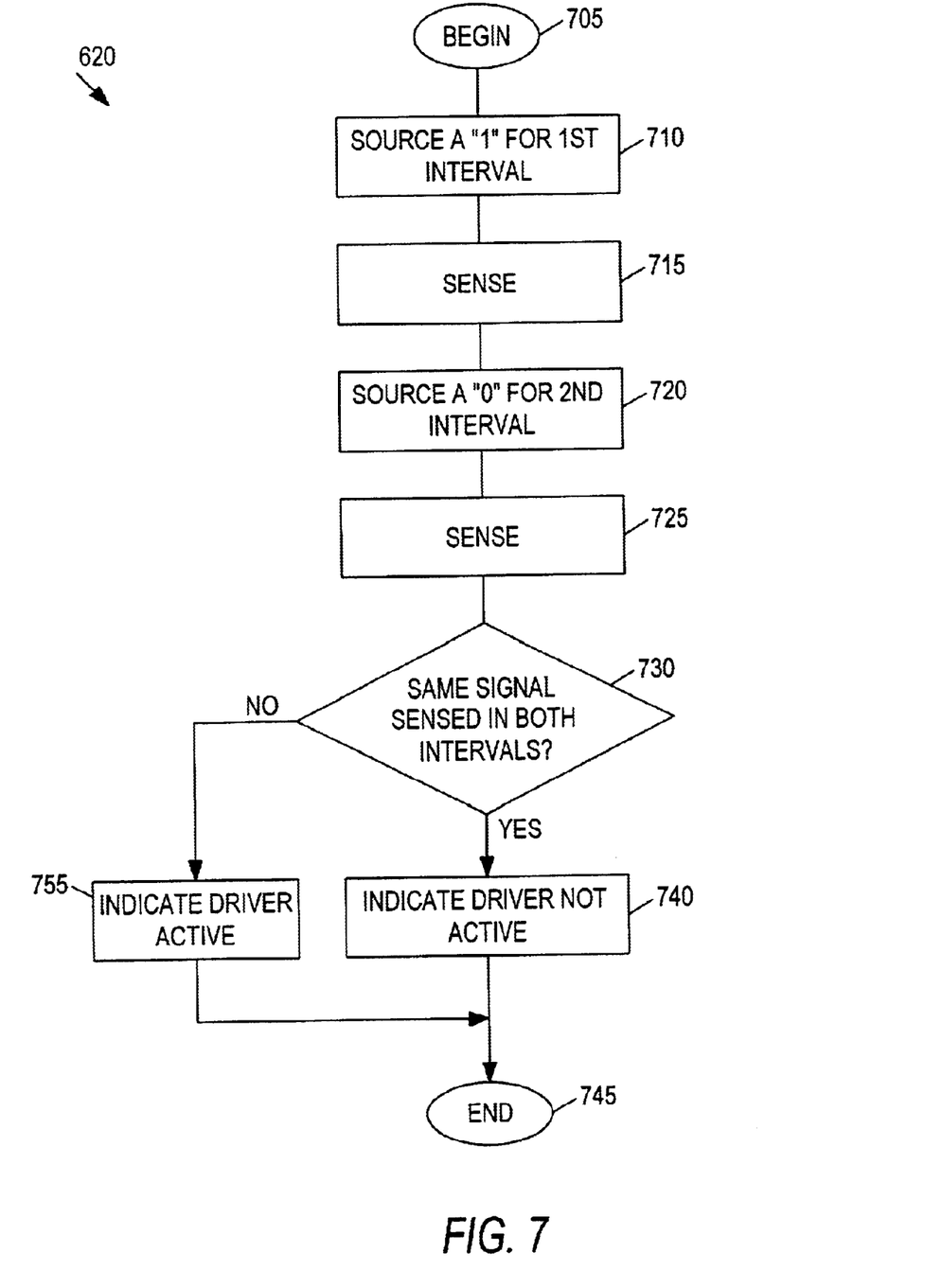
FIG. 7 illustrates certain additional method steps of the testing, according to an embodiment of the present invention.

Referring now to FIG. 7, further details are illustrated concerning step 620 in FIG. 6, according to an embodiment. After beginning at 705, a logic level "1" signal is sourced on a node of the tester at 710 for an interval during the test cycle. Next, at 715, the effect of the signal on the tester node is sensed and registered by the tester. Then, at 720, in logic level "0" signal is sourced by the tester for a next interval, and the effect of the signal is sensed and registered at step 725.

Next, at 730, the tester logic compares the registered states of the tester node in the two intervals to determine an implied state of the driver of the device under test. If the same signal is sensed on the node in both intervals, this means that the driver of the device under test was active and overpowered the signals sourced by the tester, and at 755 an indication is returned to that effect. If the different signals are sensed on the node in the two intervals, this means that the driver of the device under test was not active and the two different signals sourced by the tester drove the node to two respectively different states, and at 740 an indication is returned to that effect. The detection steps of FIG. 7 then end at 745.

Figure 8:
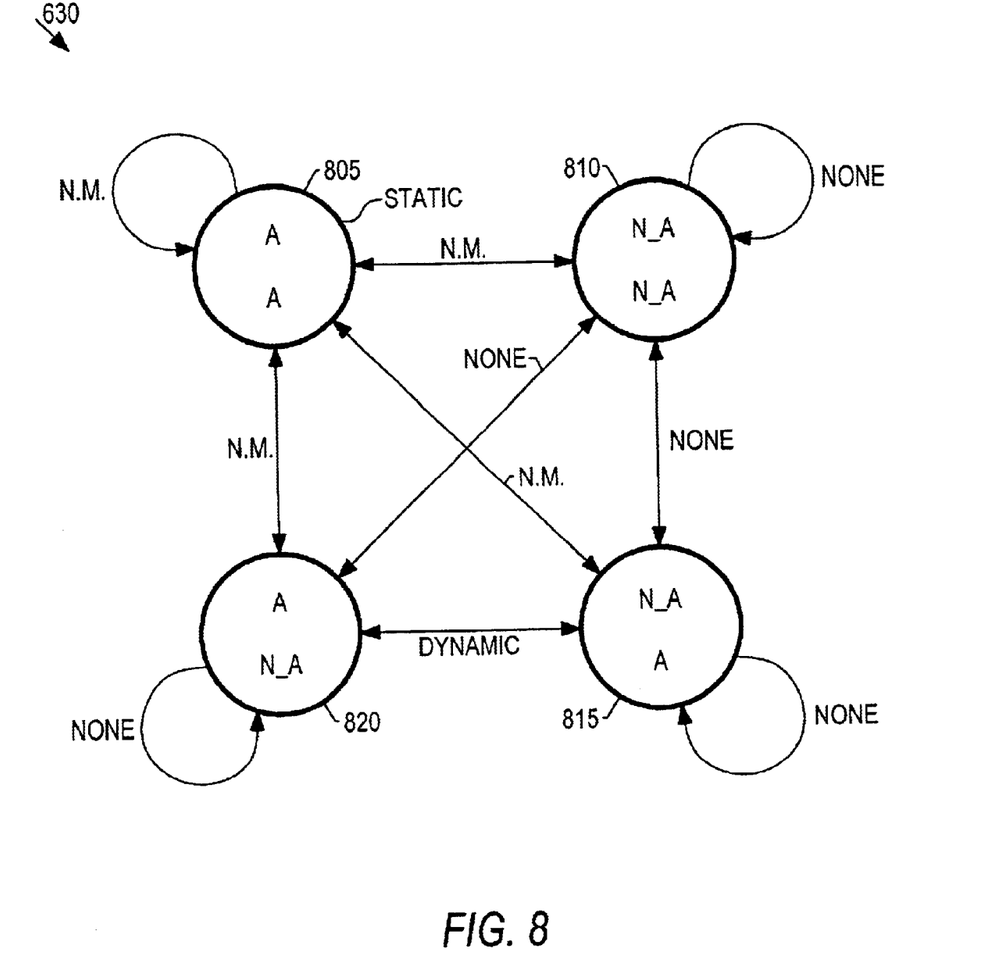
FIG. 8 illustrates, in a state diagram form, certain aspects of detecting static and dynamic contention, according to an embodiment of the present invention.

Referring now to FIG. 8, further details are illustrated in the form of a state diagram concerning step 630 in FIG. 6, according to an embodiment. In the state diagram of FIG. 8 the states 805, 810, 815 and 820 indicate the states during a test cycle of two drivers under test, such as driver 216 and driver 226. In FIG. 8, "A" indicates an active driver, and "N_A" indicates an inactive driver. Dynamic contention is detected in comparing driver states in successive cycles, and therefore is represented in the state diagram as arising from transitions among the states 805, 810, 815 and 820. As shown, dynamic contention arises from a transition from state 815 to state 820 or vice versa, where in a first state one of the drivers is active and the other is inactive, and in a next state the previously active driver becomes inactive and the previously inactive driver becomes active. In contrast to dynamic contention, static contention arises during a single cycle when both drivers are active, i.e., state 805. Therefore, state 805 itself indicates static contention, and any transition to or from state 805 is not meaningful ("N.M.").

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, it is important to note that while the present invention has been described primarily in the context of a hardware implementation, those of ordinary skill in the art will appreciate that at least certain aspects of the tester 140, particularly the tester logic 250 may be implemented as a fully functioning data processing system. Furthermore, processes of the present invention are capable of being distributed in the form of a computer readable medium of instructions in a variety of forms. The present invention applies equally regardless of the particular type of signal bearing media actually used to carry out the distribution. Examples of computer readable media include RAM, flash memory, recordable-type media, such a floppy disk, a hard disk drive, a ROM, and CD-ROM, and transmission-type media such as digital and analog communications links, e.g., the Internet.

It should also be understood that the tester described herein may be applied in a variety of contexts. For example, the tester 140 of FIG. 1 may also be interposed on bus 125 between the bridge 120 and the memory 130 in a subsequent test, or even during a test concurrent to the test of the functioning of the bridge 120 with the CPU 110. More generally, the tester may be interposed between logics having drivers that share a node or conductor irrespective of the nature of the logics.

What is claimed is:

1. A method for testing, comprising the steps of:
   interposing a tester between first and second logic, wherein the first logic and second logic have respective first and second output drivers;
   operating the tester in test cycles;
   detecting dynamic contention responsive to a signal asserted by the first driver during one of the test cycles and a signal asserted by the second driver during an immediately succeeding one of the test cycles; and
   detecting static contention responsive to a signal asserted by the first driver during one of the test cycles and a signal asserted by the second driver during the same one of the test cycles.

2. A method for testing, comprising the steps of:
   interposing a tester between first and second logic, wherein the first logic and second logic are capable of operating at respective specified operating frequencies and have respective first and second output drivers; and operating the tester and the first and second logic in test cycles, at a test frequency lower than the specified operating frequencies, to periodically test for contention between the drivers, wherein the periodic testing for contention comprises the steps of:
  decoupling the respective first and second logic from one another by the tester during a first interval of such a test cycle, the first interval beginning after the drivers have driven respective driver signals;
  detecting the driver signals by the tester during the first interval; and
  recoupling the respective first and second logic drivers to one another by the tester during a second interval, following the first interval, to permit data transfer between the first and second logic.

3. The method of testing of claim 2, wherein the periodic testing for contention comprises the steps of:
  detecting dynamic contention responsive to a signal asserted by the first driver during one of the test cycles, and a signal asserted by the second driver during an immediately succeeding one of the test cycles.

4. The method of testing of claim 2, wherein the periodic testing for contention comprises the steps of:
  detecting static contention responsive to a signal asserted by the first driver during one of the test cycles and a signal asserted by the second driver during the same one of the test cycles.

5. A method for testing, comprising the steps of:
  interposing a tester between first and second logic, wherein the first logic and second logic have respective first and second output drivers, wherein a first tester node is coupled to the first logic driver, a second tester node is coupled to the second logic driver, and a tester switch is coupled to the first and tester second nodes; and
  operating the tester in test cycles to periodically test for contention between the drivers, wherein the periodic testing comprises the steps of:
    decoupling the respective first and second logic from one another by opening the tester switch during a certain interval of the test cycles;
    sensing a signal on the first tester node by a first test receiver during the certain interval; and
    sensing a signal on the second tester node by a second test receiver during the certain interval, wherein the logic driver signals are detected responsive to the tester node sensing.

6. The method of claim 5, wherein detecting logic driver signals comprises the steps of:
  asserting signals by respective first and second test sources coupled to the tester nodes and registering respective tester node signals sensed by the respective test receivers during one portion of the certain interval;
  de-asserting signals by the respective first and second test sources and registering respective tester node signals sensed by the respective test receivers during another portion of the certain interval; and
  determining the signals driven by the logic driver signals responsive to the registered tester node signals.

7. The method of claim 6, wherein the periodic testing for contention comprises the step of:
  detecting static contention responsive to a signal asserted by the first logic driver during one of the test cycles and a signal asserted by the second logic driver during the same one of the test cycles.

8. The method of claim 6, wherein the periodic testing for contention comprises the step of:
  detecting dynamic contention responsive to a signal asserted by the first logic driver during one of the test cycles, and a signal asserted by the second logic driver during an immediately succeeding one of the test cycles.

9. A computer program product for testing, comprising:
  instructions for operating a tester in test cycles, wherein the tester is interposed between first and second logic, and the first logic and second logic have respective first and second output drivers;
  instructions for detecting dynamic contention responsive to a signal asserted by the first driver during one of the test cycles and a signal asserted by the second driver during an immediately succeeding one of the test cycles; and
  instructions for detecting static contention responsive to a signal asserted by the first driver during one of the test cycles and a signal asserted by the second driver during the same one of the test cycles.

10. A computer program product for testing first and second logic, wherein the first logic and second logic are capable of operating at respective specified operating frequencies and have respective first and second logic output drivers, the computer program product comprising:
  first instructions for operating a tester in test cycles, at a test frequency lower than the specified operating frequencies, to periodically test for contention between the logic drivers, wherein the first instructions comprise:
    second instructions for decoupling the respective first and second logic from one another by the tester during a first interval of such a test cycle, the first interval beginning after the drivers have driven respective driver signals;
    third instructions for detecting the driver signals by the tester during the first interval; and
    fourth instructions for recoupling the respective first and second logic drivers to one another by the tester during a second interval, following the first interval, to permit data transfer between the first and second logic.

11. The computer program product of claim 10, wherein the first instructions comprise:
  instructions for detecting dynamic contention responsive to a signal asserted by the first driver during one of the test cycles, and a signal asserted by the second driver during an immediately succeeding one of the test cycles.

12. The computer program product of claim 10, wherein the first instructions comprise:
  instructions for detecting static contention responsive to a signal asserted by the first driver during one of the test cycles and a signal asserted by the second driver during the same one of the test cycles.

13. The computer program product of claim 10, wherein the third instructions comprise:
  instructions for decoupling the respective first and second logic from one another by causing a switch of the tester to open during a certain interval of the test cycles;
  instructions for sensing a signal on a first node of the tester by a first receiver of the tester during the certain interval; and
  instructions for sensing a signal on a second node of the tester by a second receiver of the tester during the certain interval, wherein the logic driver signals are detected responsive to the tester node sensing.

14. The computer program product of claim 10, wherein instructions for the detecting of the logic driver signals comprise:
  instructions for i) asserting signals by respective first and second test sources of the tester coupled to the tester nodes, and ii) registering respective tester node signals sensed by the respective test receivers during one portion of the certain interval;

instructions for i) de-asserting signals by the respective first and second test sources, and ii) registering respective tester node signals sensed by the respective test receivers during another portion of the certain interval; and instructions for detecting the signals driven by the logic drivers responsive to the registered tester node signals.

* * * * *

UNITED STATES PATENT AND TRADEMARK OFFICE
CERTIFICATE OF CORRECTION

PATENT NO. : 6,820,226 B2
DATED : November 16, 2004
INVENTOR(S) : Dixon et al.

It is certified that error appears in the above-identified patent and that said Letters Patent is hereby corrected as shown below:

<u>Drawings,</u>
Figure 7, please change the "NO" between 730 and 755 to -- YES --; and please change the "YES" between 730 and 740 to -- NO --.

Signed and Sealed this

Twenty-sixth Day of April, 2005

JON W. DUDAS
*Director of the United States Patent and Trademark Office*